United States Patent
Yu et al.

(10) Patent No.: US 7,466,028 B1
(45) Date of Patent: Dec. 16, 2008

(54) SEMICONDUCTOR CONTACT STRUCTURE

(75) Inventors: Chen-Hua Yu, Hsin-Chu (TW);
Wen-Chih Chiou, Miaoli (TW);
Hung-Jung Tu, Hualien (TW);
Weng-Jin Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/873,037

(22) Filed: Oct. 16, 2007

(51) Int. Cl.
*H01L 27/10* (2006.01)
*H01L 29/73* (2006.01)
*H01L 29/74* (2006.01)
*H01L 23/02* (2006.01)
*H01L 23/04* (2006.01)
*H01L 23/48* (2006.01)
*H01L 23/52* (2006.01)
*H01L 29/40* (2006.01)

(52) U.S. Cl. ............. 257/774; 257/207; 257/208; 257/211; 257/686; 257/698; 257/758; 257/759; 257/760

(58) Field of Classification Search ......... 257/207–208, 257/211, 686, 698, 758–760, 774
See application file for complete search history.

(56) References Cited

U.S. PATENT DOCUMENTS

| | | | | |
|---|---|---|---|---|
| 5,699,611 A | * | 12/1997 | Kurogi et al. | 29/840 |
| 6,759,738 B1 | * | 7/2004 | Fallon et al. | 257/690 |
| 6,903,443 B2 | * | 6/2005 | Farnworth et al. | 257/621 |
| 7,061,116 B2 | * | 6/2006 | McCormick et al. | 257/773 |
| 2004/0007376 A1 | * | 1/2004 | Urdahl et al. | 174/52.1 |
| 2008/0099770 A1 | * | 5/2008 | Mendendorp et al. | 257/79 |

* cited by examiner

*Primary Examiner*—Ida M Soward
(74) *Attorney, Agent, or Firm*—Snell & Wilmer L.L.P.

(57) ABSTRACT

A semiconductor device structure for a three-dimensional integrated circuit is provided. The semiconductor device structure includes: a substrate having a first surface and a second surface; a via defined in the substrate and extending from the first surface to the second surface; and a first plurality of contact structures on the first surface contacting the via. A cross section of each of the first plurality of contact structures parallel to the first surface has a first side and a second side, and a ratio of the longer side to the shorter side of the first side and the second side is more than about 2:1.

20 Claims, 8 Drawing Sheets

|   | Contact CD | Spacing | TSV | Max Contact No. | Contact Area/ TSV Area | New Contact Area/ TSV Area | Difference |
|---|---|---|---|---|---|---|---|
| A | 0.08D | 0.1D | D | 36 | 23.04% | 44.44% | 21.40% |
| B | 0.06D | 0.08D | D | 49 | 17.64% | 42.86% | 25.22% |
| C | 0.045D | 0.07D | D | 81 | 16.40% | 39.13% | 22.73% |

FIG. 3A

|   | Contact CD | Spacing | TSV | Max Contact No. | Contact Area/ TSV Area | New Contact Area/ TSV Area | Difference |
|---|---|---|---|---|---|---|---|
| A | 0.08D | 0.1D | D | 36 | 23.04% | 44.44% | 21.40% |
| B | 0.06D | 0.08D | 0.9D | 49 | 21.78% | 42.86% | 21.08% |
| C | 0.045D | 0.07D | 0.8D | 49 | 15.50% | 39.13% | 23.63% |

FIG. 3B

SEMICONDUCTOR CONTACT STRUCTURE

TECHNICAL FIELD

The present invention relates to a semiconductor contact structure, and more particularly, to a semiconductor contact structure of a three-dimensional integrated circuit.

BACKGROUND OF THE INVENTION

In traditional semiconductor manufacturing, integrated circuits (IC) have been built in a planar fashion, with a single layer of transistors. New developments in semiconductor manufacturing allow wafers to be vertically stacked. Vertically integrated circuits refer to semiconductor circuits produced by traditional planar technology which are disposed vertically one above the other in several levels, resulting in three-dimensional integrated circuits. This allows integrated circuits to have a higher device density and a smaller chip area.

Three-dimensional integrated circuits typically contain multiple conductive layers separated by one or more dielectric layers. Contact structures disposed in via openings in the dielectric layers provide conductive paths so that electrical signals can pass from one conductive layer to another conductive layer.

FIGS. 1A and 1B illustrate a side view and a top view of a prior art contact stricture in one layer of a three-dimensional integrated circuits respectively. A through-substrate-via (TSV) 110 is built in a substrate 100 to provide a vertical connection to another layer, and a plurality of contact structures 120 are overlaid the top surface of the TSV 110, which can be electrically connected to devices built above the substrate 100 through a metal line 130. At present, since no special contact structure design is applied for 3D TSV wafers, the size, shape, and the configuration of the contact structures 120 follow the design rule of the traditional planar process, as shown in FIG. 1B. Therefore, the process window of contact etching may be limited. In addition, the electrical flow defined in the traditional design rule is usually much smaller than the electrical flow passing through the TSV 110. Therefore, the electrical flow of three-dimensional IC will be limited, and there may be a possible electromigration (EM) issue at contact interfaces, which will limit product types.

Accordingly, as designs move to three dimensions, a new contact structure is required to solve the aforementioned problems.

SUMMARY OF THE INVENTION

To solve the above-mentioned problems, the present invention provides a novel contact structure and a novel transmission interconnect structure for a three-dimensional integrated circuit. The present invention is capable of preventing possible EM issue and of enlarging process window of contact etching.

According to an aspect of the present invention, a semiconductor device structure for a three-dimensional integrated circuit is provided. The semiconductor device structure includes: a substrate having a first surface and a second surface; a via defined in the substrate and extending from the first surface to the second surface; and a first plurality of contact structures on the first surface contacting the via. A cross section of each of the first plurality of contact structures parallel to the first surface has a first side and a second side, and a ratio of the longer side to the shorter side of the first side and the second side is more than about 2:1.

According to another aspect of the present invention, a semiconductor device structure for a three-dimensional integrated circuit is provided. The semiconductor device structure includes: a substrate having a first surface and a second surface; a via defined in the substrate and extending from the first surface to the second surface; and a plurality of contact structures on the first surface contacting the via. A cross section of each of the plurality of contact structures parallel to the first surface has a first side and a second side. A ratio of the longer side to the shorter side of the first side and the second side is more than about 2:1, and a ratio of an area of the plurality of contact structures to an area of the via parallel to the first surface is more than 25%. The diameter of the TSV is less than about 5 µm. The minimum length of the short side is less than about 0.4 µm and the spacing of the contact structures is less than about 0.5 µm, the minimum length of short side and the spacing combined to be a minimum pitch of the contact structures is less than about 0.9 µm.

According to a further aspect of the present invention, a multi-chip semiconductor structure is provided. The multi-chip semiconductor structure includes a first chip and a second chip attaching to the first chip, wherein the first chip includes: a first substrate having a first surface and a second surface; a first via defined in the first substrate and extending from the first surface to the second surface; and a first plurality of contact structures on the first surface contacting the first via. A cross section of each of the first plurality of contact structures parallel to the first surface has a first side and a second side, and a ratio of the longer side to the shorter side of the first side and the second side is more than about 2:1. A ratio of an area of the first plurality of contact structures to an area of the first via parallel to the first surface is more than 25%. The diameter of the first via is less than about 5 µm. The minimum length of the second side is less than about 0.4 µm and the spacing of the first plurality of contact structures is less than about 0.5 µm, the minimum length of second side and the spacing combined to be a minimum pitch of the first plurality of contact structures is less than about 0.9 µm.

The objectives, embodiments, features, and advantages of the invention will be apparent from the following more particular description of preferred embodiments and drawings of the invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying pictures, wherein:

FIGS. 3A-3B are tables listing the contact area ratios for different 3DIC scenarios.

DETAILED DESCRIPTION OF THE PREFERRED EMBODIMENTS

The present invention relates to a semiconductor contact structure of a three-dimensional integrated circuit. The present invention will be described more fully hereinafter with reference to the FIGS. 2-6. With the contact structures, semiconductor device structures and multi-chip semiconductor structures provided by the present invention, the contact area ratio could be significantly elevated, and thus possible EM issues are prevented and the process window of contact etching is enlarged. However, the devices, elements and methods in the following description are configured to illustrate the present invention, and should not be construed in a limiting sense.

Figure 2A:
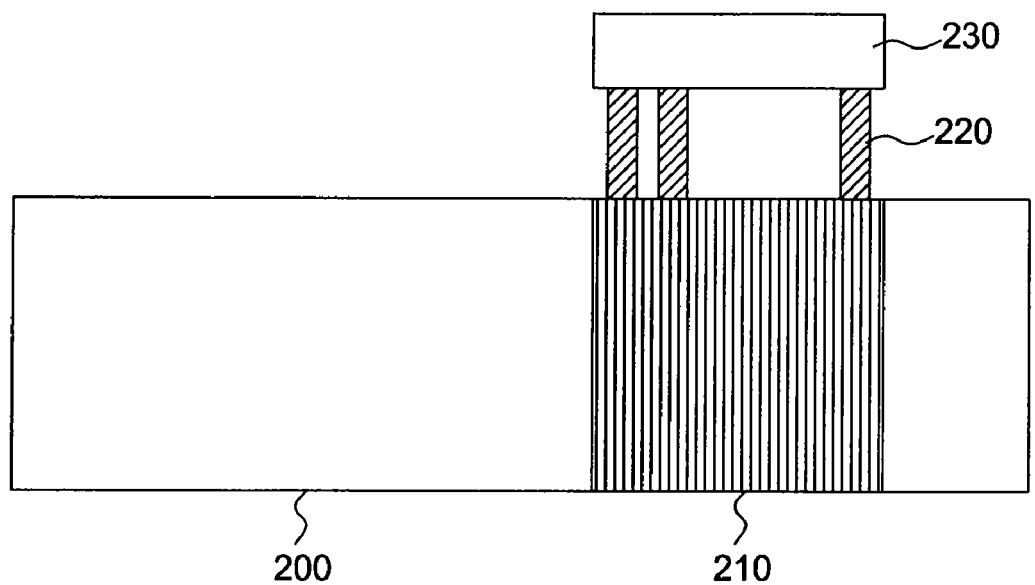
FIG. 2A is a side view of contact structures for a three-dimensional integrated circuits according to the present invention.

FIG. 2A is a side view of contact structures for a three-dimensional integrated circuits according to the present invention, and FIGS. 2B-2E illustrate several layout patterns of the contact structures according to various embodiments of the present invention.

Referring to FIG. 2A, a substrate 200 having a through substrate via (TSV) 210 defined therein is provided. The substrate may comprise silicon, germanium, silicon germanium or other semiconductor material. A plurality of contact structures 220 are on the top surface of the TSV 210 and connected to a metal line 230. Semiconductor elements (such as logic elements) may be formed over the substrate 200 by methods well known in the art, and may be coupled to the TSV 210 through the metal line 230 and the contact structures 220. The TSV 210 may include tungsten, polysilicon, copper, ruthenium, or a combination thereof, and the contact structures 220 may include tungsten, aluminum, copper, ruthenium, or a combination thereof, and the metal line 230 may include tungsten, aluminum, copper, ruthenium, or a combination thereof.

Figure 2B:
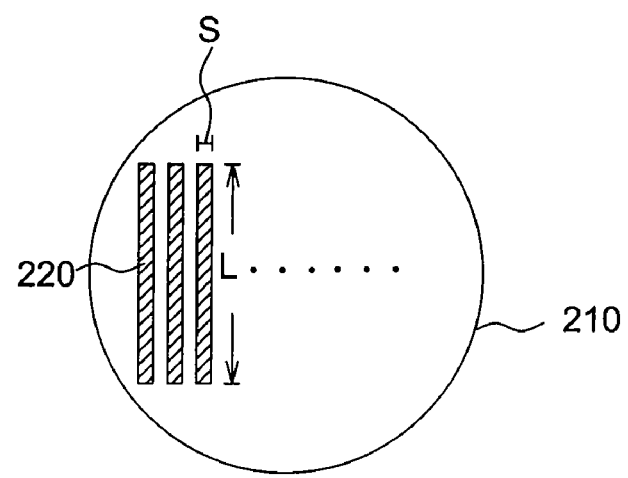
FIGS. 2B-2E illustrate several layout patterns of the contact structures according to embodiments of the present invention.

Referring to FIGS. 2B-2E, new three-dimensional IC contact structures are provided to overcome the prior art problems. These structures follow the existing design rule, and therefore the present invention can be implemented directly without additional process issues. It will be noted in FIGS. 2B-2E that the shape of TSV 210 may include but not limited to a square. For example, the shape of TSV 210 may be circular or rectangular. In one embodiment that the TSV 210 may have a circular shape, and for example, the diameter of the TSV 210 could be from sub-micron level to micron level. Preferably the diameter of the TSV 210 is between about 2 um and about 5 um, as shown in FIG. 2B.

Figure 3C:
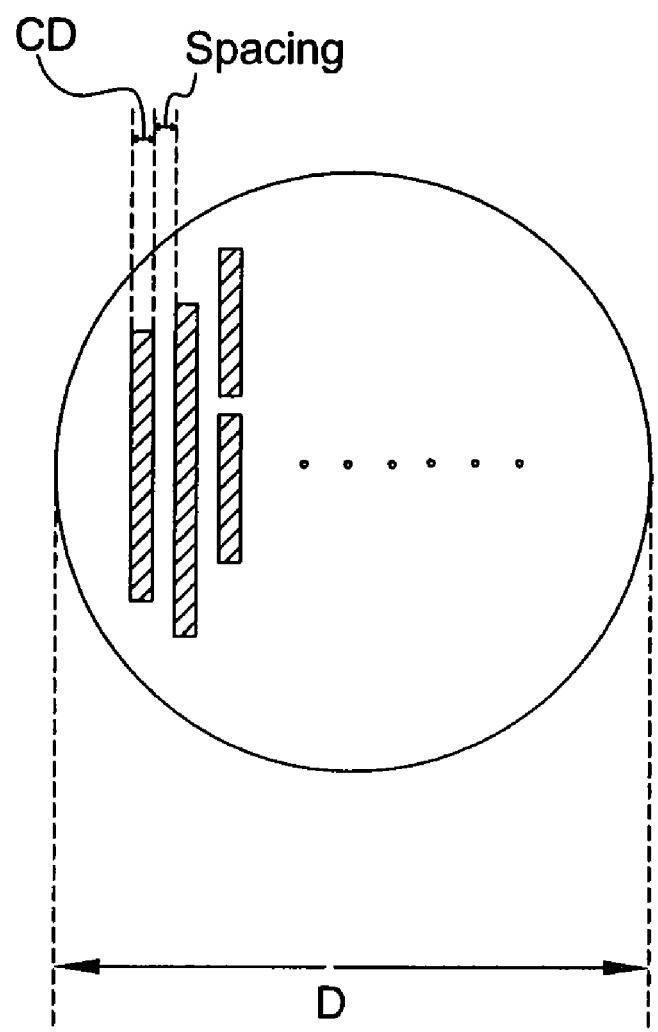
FIG. 3C illustrates the definitions of CD, spacing and through-substrate-via (TSV) size D.

In FIG. 2B, each of the contact structures 220 is a rectangle with a long side (L) and a short side (S), and an aspect ratio of the long side to the short side (L/S) is preferably more than about 2:1. The minimum length of the short side and the pitch of the contact structures 220 are limited by the employed design rule. FIG. 3A to FIG. 3C have defined the relationship between TSV size (D) and the contact critical dimension (CD) and spacing while using the same or shrinking TSV size for different technology node.

Figure 2C:
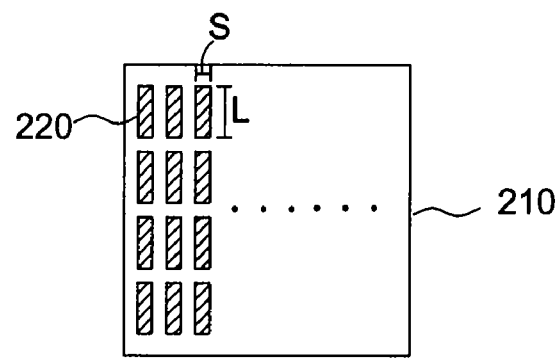
Figure 2D:
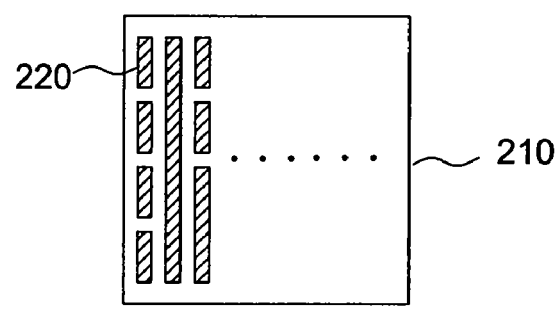
Figure 2E:
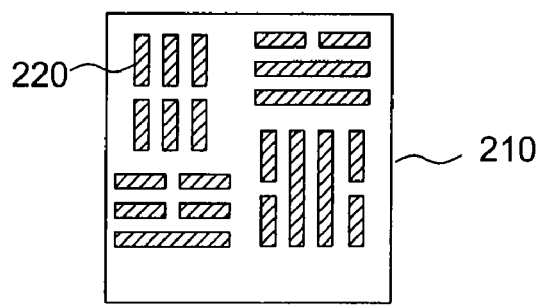

FIG. 2C is similar to FIG. 2B, except that the contact structures 220 has a smaller aspect ratio of the long side to the short side, and the top surface of the via 210 is designed in a circular shape. FIG. 2D shows a combinational type of the contact structures 220, in which the long sides of the contact structures 220 may have different sizes. FIG. 2E shows another combinational type of the contact structures 220, in which the contact structures 220 may have different long sides and may be aligned along different directions. The embodiments shown in FIGS. 2B-2E may bring different contact area ratios suitable meeting different requirements. FIGS. 2B-2E are only some possible patterns of the contact structures 220, and the present invention is not limited to these patterns. Any rectangular shapes and the combination thereof (such as L-shape) which follow the employed design rule can be applied in the present invention.

Figure 1A:
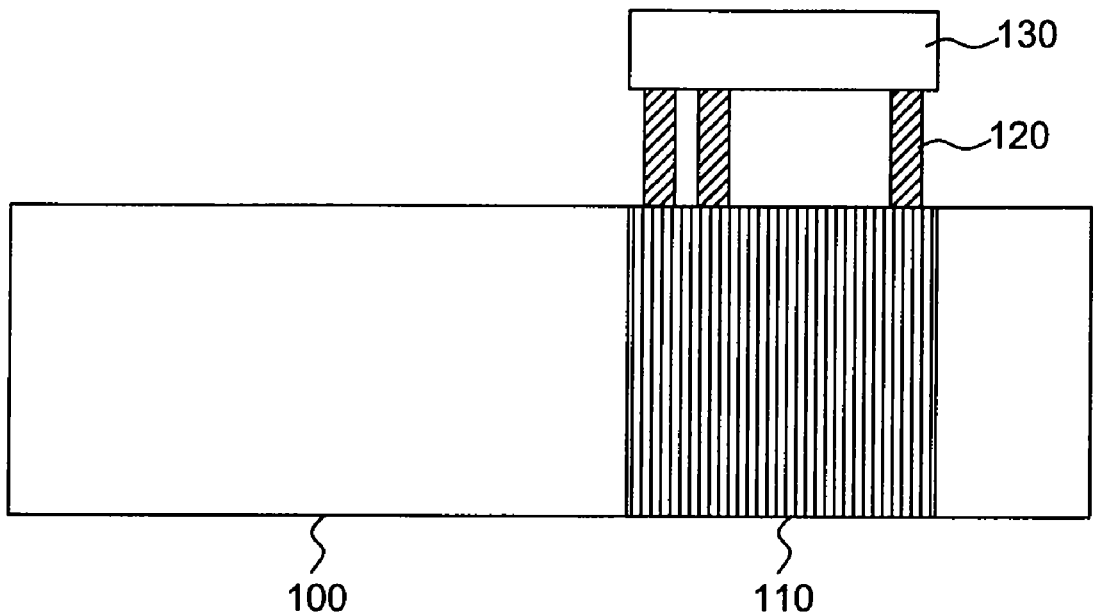
FIGS. 1A and 1B illustrate a side view and a top view of contact structures according to the prior art in one layer of a three-dimensional integrated circuit respectively.
Figure 1B:
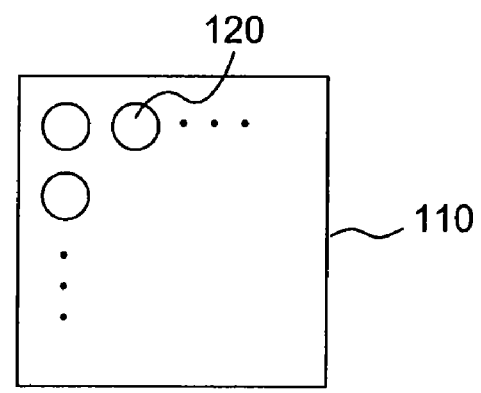

FIGS. 3A and 3B are tables listing the contact area ratios for different 3DIC scenarios, and FIG. 3C illustrates the definitions of CD, spacing and TSV size D. In FIG. 3A, the TSV size maintains the same as technology node shrinks, and in FIG. 3B, the TSV size shrinks as technology node shrinks in FIG. 3B. Referring to FIG. 3A, for technology group A, the contact CD and spacing of the contact structures 220 are defined according to the TSV size D as 0.08D and 0.1 D. While technology node shrink from Group A to Group B, the TSV size D is kept the same, the contact CD and spacing of the contact structures 220 are shrunk from 0.08D and 0.1 D to 0.06D and 0.08D respectively. Still referring to FIG. 3A, in group A, the diameter of the TSV is D, the critical dimension of each contact is 0.08D, the minimum spacing between two adjacent contacts is 0.1 D, and the maximum contact number is 36. The ratio of the total contact area to the TSV area is 23.04% for the prior art contact structures as FIG. 1B, and is 44.44% for the contact structures of the present invention. Comparing with the contact structure of prior art as FIG. 1B, the area ratio of the contact to the TSV has been increased 21.40% according to the present invention. In groups B and C, which have shrinking critical dimension of contact comparing with groups A but with same TSV diameter D, the area ratios of the present invention have been increased 25.22% and 22.73% respectively as comparing with the prior art. The group A, B, C with shrink technology node with same TSV size D, while employing the contact structure design according to the present invention, can improve a ratio of an area of the plurality of contact structures to an area of the top surface of the via from lower than 25% to more than 25%.

Since the diameter D of TSV 210 is less than about 5 μm, in one embodiment, for technology node of the group A in FIG. 3A, the minimum length of the short side is less than about 0.4 μm and the spacing of the contact structures 220 is less than about 0.5 μm, hence the minimum length of short side and the spacing combined to a minimum pitch of the contact structures 220 is less than about 0.9 μm. In another embodiment, for a shrink technology node (group B in FIG. 3A) with tightened design rule, with same TSV size D which is less than about 5 μm, the minimum length of the short side is less than about 0.3 μm, the spacing of contact structures 220 is less than about 0.4 μm; hence, the minimum length of short side and the spacing combined to a minimum pitch of the contact structures 220 is less than about 0.7 μm.

Referring to FIG. 3B, in groups B and C, the TSV size shrink from D to 0.9D and 0.8D respectively as technology node shrinks, and the area ratios of the present invention in groups B and C have been increased 21.08% and 23.63% respectively as comparing with the prior art. In one embodiment, for a shrink technology node with more tightened design rule (group B in FIG. 3B), the diameter of TSV 210 is less than about 4.5 μm (shrank from D to as 0.9D), the minimum length of the short side is less than about 0.3 μm and the spacing of the contact structures 220 is less than about 0.4 μm; hence, the minimum length of short side and the spacing combined to a minimum pitch of the contact structures 220 is less than about 0.7 um.

Figure 4A:
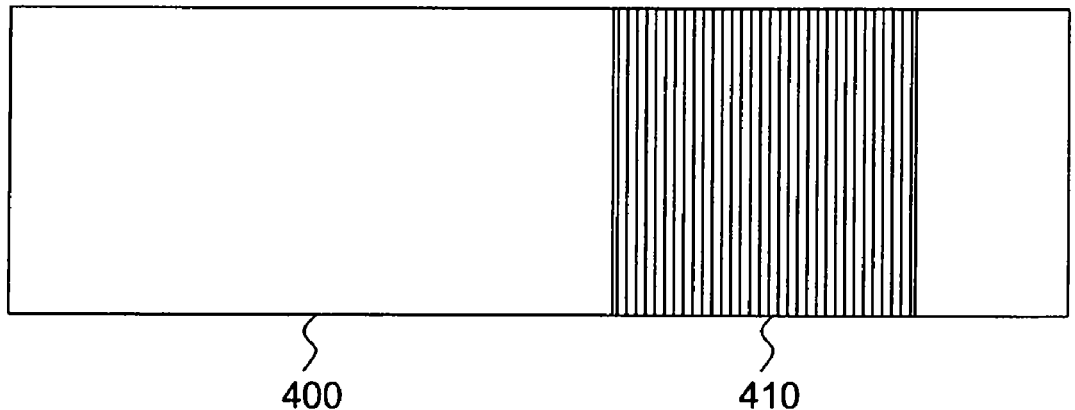
FIGS. 4A-4B illustrate the vias of the present invention applied to different applications.
Figure 4B:
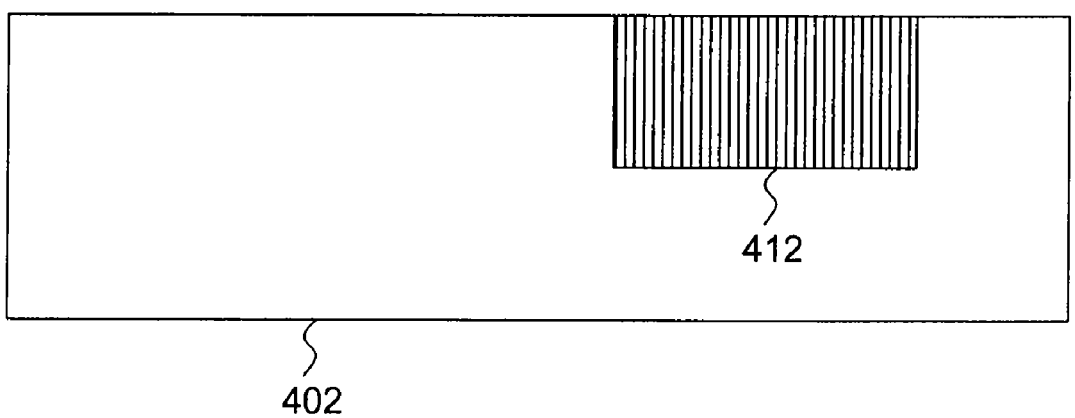

Referring to FIGS. 4A and 4B, the contact structure of the present invention can be applied above a via 410 through a substrate 400, and also can be applied above a via 412 embedded in a substrate 402. The structure shown in FIG. 4A may be applied to fabricate a transmission line, a Faraday cage, or an inductor. The structure shown in FIG. 4B may be applied to a thermal via for spreading thermal energy.

Figure 5A:
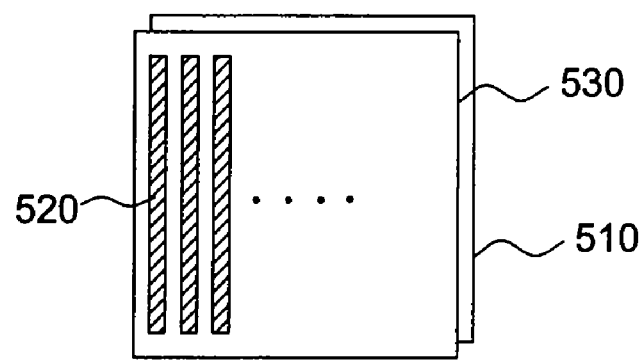
FIGS. 5A and 5B illustrate top views of semiconductor device structures according to the present invention.
Figure 5B:
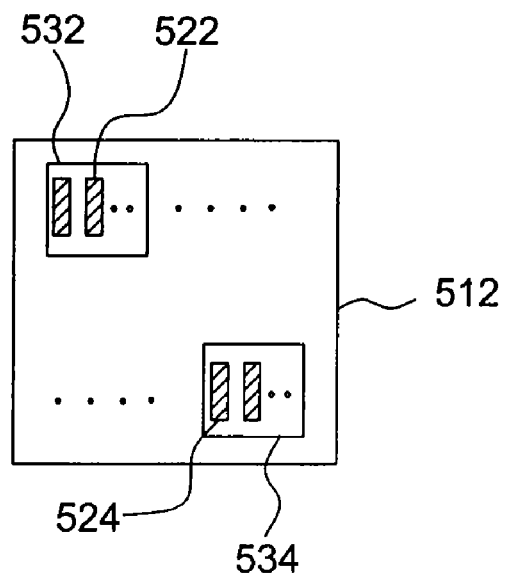

FIGS. 5A and 5B illustrate top views of semiconductor device structures according to the present invention. Referring to FIG. 5A, a via 510 is coupled to a metal line 530 through a plurality of contact structures 520, wherein the via 510 and the metal line 530 are substantially the same size. The metal line 530 may include tungsten, aluminum, copper, ruthenium, or a combination thereof. The structure shown in FIG. 5A may be applied to a structure suffering large current, such as an EM test structure or an I/O structure. Referring to FIG. 5B, a via 512 is coupled to a plurality of metal lines 532 and 534 through contact structures 522 and 524 respectively, wherein the size of the via 512 is much larger than the size of metal line 532 or 534. The metal lines 532 may include tungsten, aluminum, copper, ruthenium, or a combination thereof. The structure shown in FIG. 5B may be applied to a general transmission line.

Figure 6:
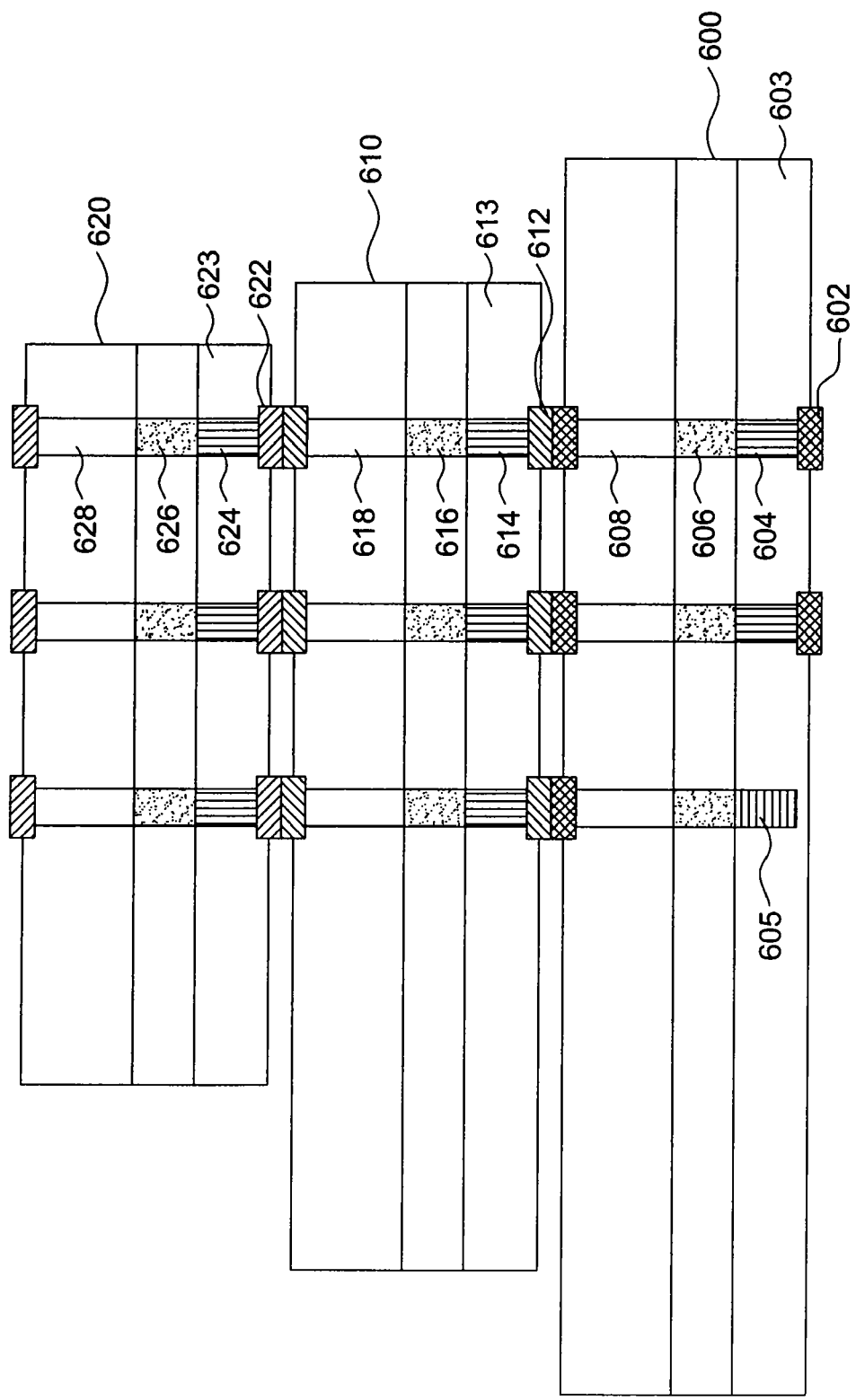
FIG. 6 is a side view of a multi-chip semiconductor structure according to one embodiment of the present invention.

FIG. 6 is a side view of a multi-chip semiconductor structure according to one embodiment of the present invention, which includes a first chip 600, a second chip 610 attaching to the first chip 600, and a third chip 620 attaching to the second chip 610. The first chip 600 includes bonding pads 602, a substrate 603, vias 604, contact structures 606, and metal lines 608. The second chip 610 includes bonding pads 612, a substrate 613, vias 614, contact structures 616, and metal lines 618. The third chip 620 includes bonding pads 622, a substrate 623, vias 624, contact structures 626, and metal lines 628. The vias 604, 614, and 624 may be penetrated through the substrates 603, 613, and 623 respectively. In another embodiment, the chip 600 may further include a via 605 which is embedded in the substrate 603. The metal lines 608, 618 and 628 may include tungsten, aluminum, copper, ruthenium, or a combination thereof. Each of the contact structures 606, 616, and 626 has a plurality of contact structures, and each contact structure has a first side and a second side, with a ratio of the longer side to the shorter side of the first side and the second side more than about 2:1, as described above. For at least one chip, a ratio of an area of the plurality of contact structures to an area of the top surface of the via is more than 25%, and more preferably more than 30%. A ratio of an area of the plurality of contact structures to an area of the top surface of the via is more than 25%. The diameter of the via is less than about 5 um. The minimum length of the second side is less than about 0.4 µm and the spacing of the plurality of contact structures is less than about 0.5 µm, the minimum length of the second side and the spacing combined to be a minimum pitch of the plurality of contact structures is less than about 0.9 µm.

The present invention provides a unique and easy-to-check contact structure for three-dimensional IC. The contact structures of the present invention can prevent possible EM issue at contact and deep via conductive material interfaces, and can enhance electrical current in transmission interconnects which can enable different 3D wafer products.

The above description is only for preferred embodiments, but not to limit the scope of the present invention. Any other equivalent changes or modifications performed with the spirit disclosed by the present invention should be included in the appended claims.

We claim:

1. A semiconductor device structure for a three-dimensional integrated circuit, comprising:
a substrate having a first surface and a second surface;
a via defined in the substrate and extending from the first surface to the second surface; and
a first plurality of contact structures on the first surface contacting the via, a cross section of each of the first plurality of contact structures parallel to the first surface having a first side and a second side;
wherein a ratio of the longer side to the shorter side of the first side and the second side is more than about 2:1.

2. The semiconductor device structure according to claim 1, wherein the via is through the substrate.

3. The semiconductor device structure according to claim 1, wherein the first plurality of contact structures is parallel in a first direction.

4. The semiconductor device structure according to claim 1, wherein the via has a diameter parallel to the first surface less than about 5 µm.

5. The semiconductor device structure according to claim 1, further comprising a second plurality of contact structures on the first surface contacting the via.

6. The semiconductor device structure according to claim 1, wherein aspect ratios of the first plurality of contact structures are not all the same.

7. The semiconductor device structure according to claim 1, wherein a cross section of the via parallel to the first surface is substantially circular.

8. A semiconductor device structure for a three-dimensional integrated circuit, comprising:
a substrate having a first surface and a second surface;
a via defined in the substrate and extending from the first surface to the second surface; and
a plurality of contact structures on the first surface contacting the via, a cross section of each of the plurality of contact structures parallel to the first surface having a first side and a second side;
wherein a ratio of the longer side to the shorter side of the first side and the second side is more than about 2:1, and a ratio of an area of the plurality of contact structures to an area of the via parallel to the first surface is more than 25%.

9. The semiconductor device structure according to claim 8, wherein the via is through the substrate.

10. The semiconductor device structure according to claim 8, the ratio of an area of the plurality of contact structures to an area of the via parallel to the first surface is more than 30%.

11. The semiconductor device structure according to claim 8, wherein a cross section of the via parallel to the first surface is substantially circular with a diameter less than about 5 µm.

12. The semiconductor device structure according to claim 8, wherein the length of the second side is less than about 0.4 µm.

13. The semiconductor device structure according to claim 8, wherein the plurality of contact structures has a pitch less than about 0.9 µm.

14. The semiconductor device structure according to claim 8, wherein the number of the plurality of contact structures is more than 36.

15. A multi-chip semiconductor structure, comprising:
a first chip; and
a second chip attaching to the first chip;
wherein the first chip comprises:
a first substrate having a first surface and a second surface;
a first via defined in the first substrate and extending from the first surface to the second surface; and
a first plurality of contact structures on the first surface contacting the first via, wherein a cross section of each of the first plurality of contact structures parallel to the first surface has a first side and a second side and a ratio of the longer side to the shorter side of the first side and the second side is more than about 2:1.

16. The multi-chip semiconductor structure according to claim 15, wherein the first via is through the first substrate.

17. The multi-chip semiconductor structure according to claim 15, wherein a ratio of an area of the first plurality of contact structures to an area of the first via parallel to the first surface is more than 25%.

18. The multi-chip semiconductor structure according to claim 15, wherein a ratio of an area of the first plurality of contact structures to an area of the first via parallel to the first surface is more than 30%.

19. The multi-chip semiconductor structure according to claim 15, further comprising a third chip attaching to the second chip.

20. The multi-chip semiconductor structure according to claim 15, wherein the second chip comprises
- a second substrate having a third surface and a fourth surface;
- a second via defined in the second substrate and extending from the third surface to the fourth surface; and
- a second plurality of contact structures on the third surface contacting the second via,
- wherein a cross section of each of the second plurality of contact strictures parallel to the third surface has a third side and a fourth side and a ratio of the longer side to the shorter side of the third side to the fourth side is more than about 2:1; and
- wherein a ratio of an area of the second plurality of contact structures to an area of the second via parallel to the third surface is more than 25%.

* * * * *